United States Patent

Utsunomiya et al.

[11] Patent Number: 5,977,688
[45] Date of Patent: Nov. 2, 1999

[54] ELECTRONIC APPARATUS FOR BEING SWITCHED USING PIEZOELECTRIC ELEMENT

[75] Inventors: Fumiyasu Utsunomiya; Yutaka Saitoh; Yoshifumi Yoshida, all of Chiba; Kouei Ozaki, Meguro-ku; Toshiaki Narukawa, Oota-ku, all of Japan

[73] Assignee: Seiko Instruments R & D Center Inc., Japan

[21] Appl. No.: 08/825,353

[22] Filed: Mar. 28, 1997

[51] Int. Cl.⁶ ....................................... H01L 41/08
[52] U.S. Cl. .................... 310/316.01; 310/318; 310/319; 310/339; 310/359
[58] Field of Search ..................... 310/316, 317, 310/318, 319, 359, 367, 321, 324

[56] References Cited

U.S. PATENT DOCUMENTS

| | | | |
|---|---|---|---|
| 3,562,792 | 2/1971 | Berlincourt et al. | 310/359 X |
| 3,613,351 | 10/1971 | Walton | 310/339 X |
| 3,689,781 | 9/1972 | Kawada | 310/318 |
| 3,701,903 | 10/1972 | Merhar | 310/318 |
| 3,790,826 | 2/1974 | Kawada | 310/316 |
| 4,048,526 | 9/1977 | Taylor | 310/366 X |
| 4,185,621 | 1/1980 | Morrow | 310/339 X |
| 4,352,961 | 10/1982 | Kumada et al. | 310/324 X |
| 4,392,074 | 7/1983 | Kleinschmidt et al. | 310/318 X |
| 4,600,851 | 7/1986 | Isayama et al. | 310/324 |
| 5,341,061 | 8/1994 | Zaitsu | 310/318 |
| 5,552,656 | 9/1996 | Taylor | 310/319 X |
| 5,701,049 | 12/1997 | Kanayama et al. | 310/359 |

Primary Examiner—Mark O. Budd
Attorney, Agent, or Firm—Adams & Wilks

[57] ABSTRACT

An electronic apparatus that performs switching with the use of a piezoelectric element comprises a piezoelectric element 11, a first monitor electrode 15, and a second monitor electrode 16, the latter two being provided thereon and intended to output electric shock signals that are generated when a shock has been applied to the piezoelectric element 11 to thereby distort it. Whereby, a shock is applied to the electronic apparatus that contains the piezoelectric element 11 and a shock is applied to the built-in piezoelectric element 11. This makes it possible to output for the purpose of controlling the operation of the respective functions an electronic shock signal that is generated when the piezoelectric element 11 is distorted. As a result, it is possible to reduce the number of switch parts for, and hence the size of, the electronic apparatus and reduce the amount of time and labor for performing the switching operation by utilizing the piezoelectric effect of the piezoelectric element.

14 Claims, 8 Drawing Sheets

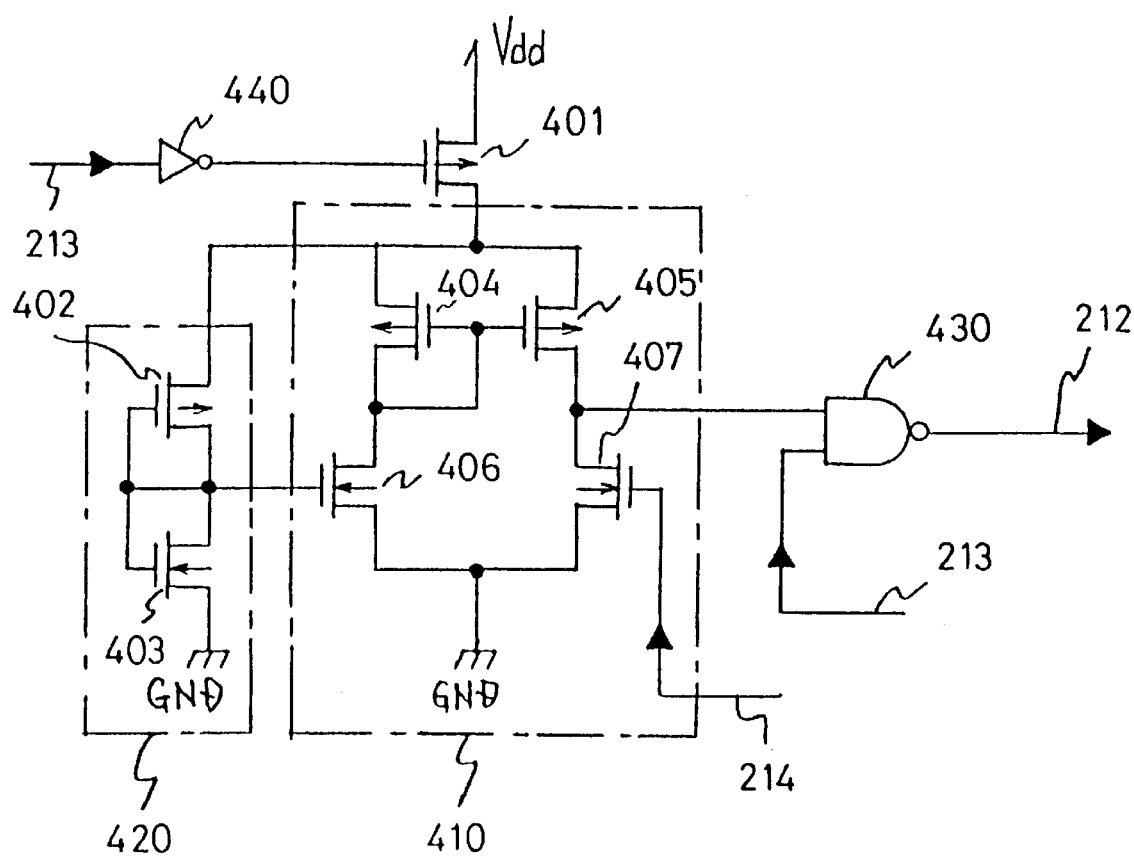
F I G. 4

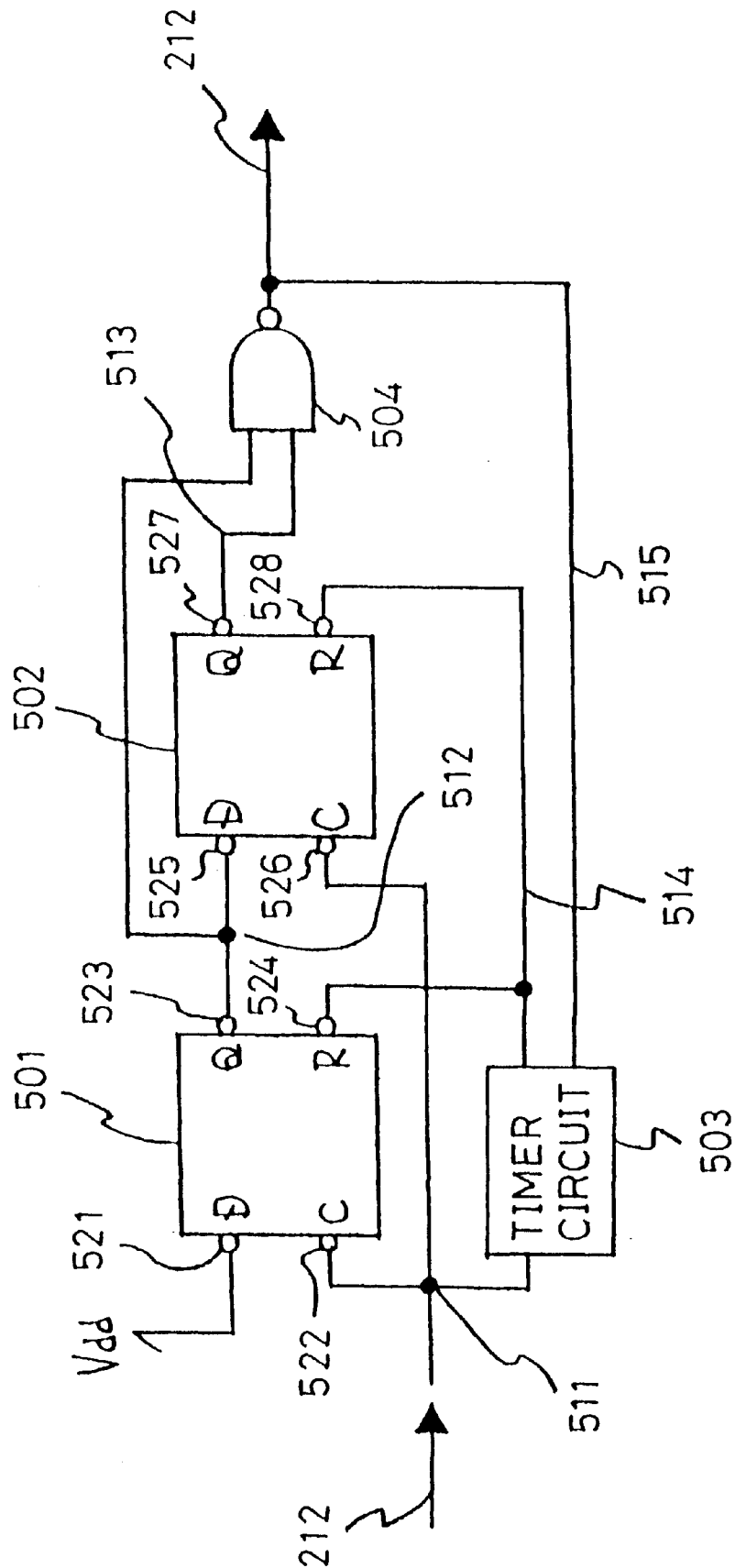
F I G. 5

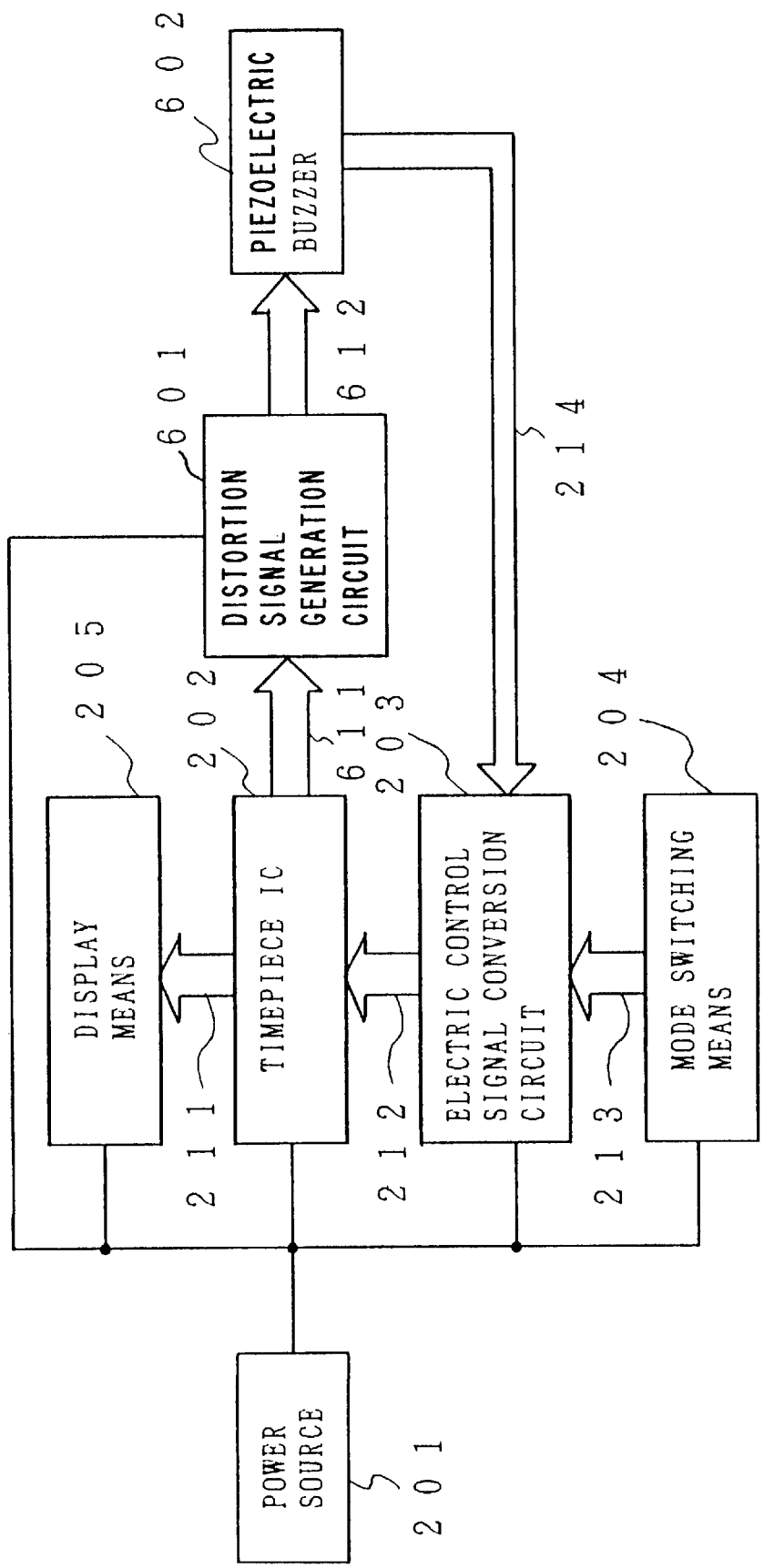
F I G. 6

ELECTRONIC APPARATUS FOR BEING SWITCHED USING PIEZOELECTRIC ELEMENT

BACKGROUND OF THE INVENTION

1. Field of the Invention

The present invention relates to an electronic apparatus having loaded thereon a piezoelectric element.

2. Description of the Related Art

A conventional electronic apparatus having a piezoelectric element loaded thereon is illustrated in FIG. 8. As illustrated in FIG. 8, a piezoelectric element output signal 812 that is outputed from a loaded function piezoelectric element 804 and an electric control signal 212 that is generated from switching means 802 are inputed to a control IC 801, whereby the drive of the loaded functions 803 has been controlled using function control signals 811 that are output from the control IC 801 in correspondence with the respective input signals.

In the above-mentioned electronic apparatus having a piezoelectric element loaded thereon, there is provided the switching means, whereby the drive of each function of the electronic apparatus is controlled by an electric control signal that has been generated from this switching means. As a result, a number of switches are needed to be provided and it is impossible to miniaturize the apparatus by the extent that corresponds to the space that is occupied by them. In addition, since the switching means must be manually operated, the amount of time and labour therefor is large.

SUMMARY OF THE INVENTION

One object of the present invention is to solve the above-mentioned problems.

In order to solve the above-mentioned problems, the present invention has taken the following measures.

On a piezoelectric element of an electronic apparatus having the piezoelectric element loaded thereon there is provided a monitor electrode that outputs an electric shock signal that is generated from the piezoelectric element, whereby the electric shock signal is outputed from the monitor electrode and there is provided an electric control signal conversion circuit for converting the electric shock signal output therefrom to an electric control signal. Whereby, the drive of the respective functions of the electronic apparatus is controlled using the electric control signal.

By taking the above-mentioned measures, the following functions can be obtained.

Since the electric control signal for controlling the drive of each function of the electronic apparatus can be generated by applying a shock to the piezoelectric element that is loaded on the electronic apparatus, it becomes unnecessary to use the switching means for generating this electric control signal. In addition, it is possible to miniaturize the electronic apparatus by the extent that corresponds to the use of no switching means. In addition, it is possible to omit the time and labour that manually operate the switching means in order to generate the electric control signal.

BRIEF DESCRIPTION OF THE DRAWINGS

FIG. 4 is a simplified circuit diagram illustrating an electric pulse conversion circuit portion within the electric control signal conversion circuit of a wrist watch having a wrist band according to the second embodiment of the present invention;

FIG. 5 is a simplified circuit diagram illustrating an electric control signal conversion circuit portion within the electric control signal conversion circuit of a wrist watch having a wrist band according to the second embodiment of the present invention;

FIG. 6 is a simplified block diagram illustrating a wrist watch having a wrist band according to a third embodiment of the present invention;

DETAILED DESCRIPTION OF THE PREFERRED EMBODIMENTS

Embodiments of the present invention will now be explained with reference to the drawings.

Figure 1:
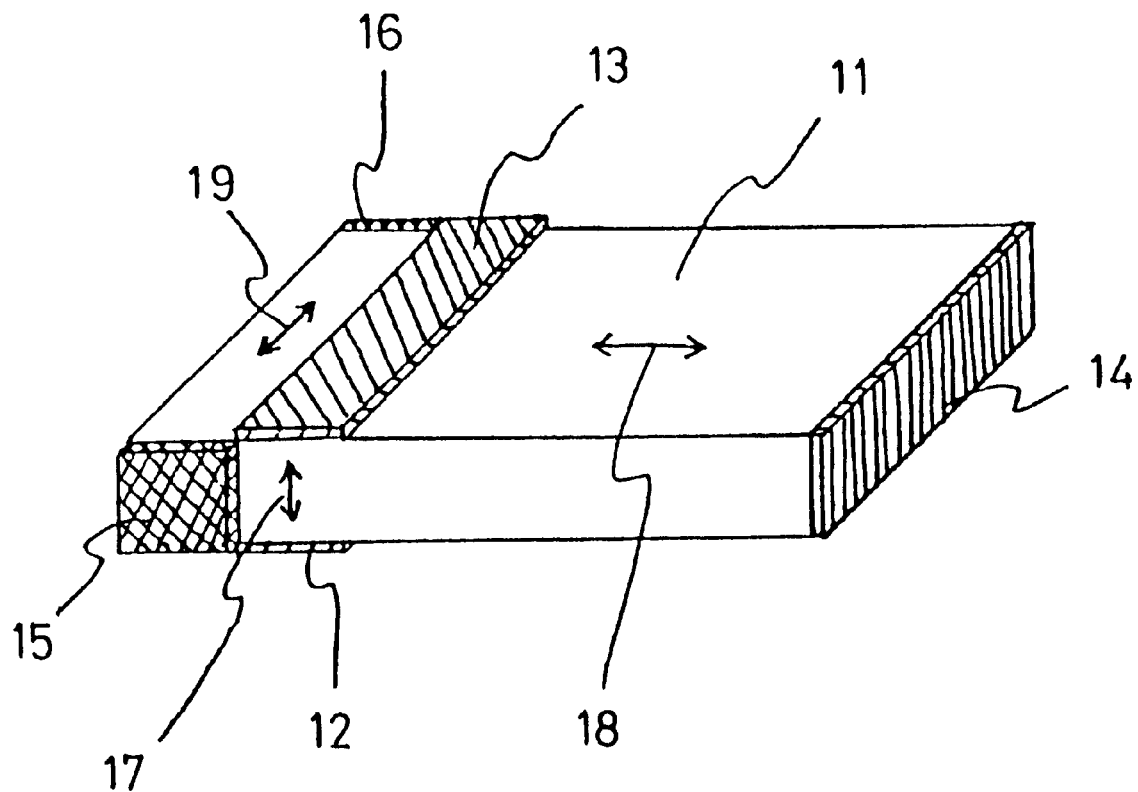
FIG. 1 is a typical outline view illustrating a piezoelectric transducer that uses a piezoelectric element according to a first embodiment of the present invention.

FIG. 1 is a typical outline view illustrating a piezoelectric transducer that utilizes a piezoelectric element according to a first embodiment of the present invention.

The piezoelectric transducer is composed of a first input electrode 12 and second input electrode 13 for inputting thereto an electric resonance signal for causing the resonance of a piezoelectric element 11, an output electrode 14 for inputting thereto the electric resonance signal and outputting an electric amplification signal which when the piezoelectric element 11 has resonated is generated from this piezoelectric element 11 and whose amplitude has been more amplified than that of the electric resonance signal, and a first monitor electrode 15 and second monitor electrode 16 for monitoring an electric shock signal that is generated from the piezoelectric element 11 when a shock has been applied thereto. Poling is performed of the portion of the piezoelectric element that is sandwiched between the first input electrode 12 and the second input electrode 13 in A directions 17, poling is performed of the portion of the piezoelectric element that is sandwiched between the portion of the piezoelectric element sandwiched between the first input electrode 12 and second input electrode 13 and the output electrode 14 in B directions 18, and poling is performed of the portion of the piezoelectric element that is sandwiched between a first monitor electrode 15 and a second monitor electrode 16 in C directions 19.

By the above-mentioned construction, when the electric resonance signal is input to the second input electrode 13 with the first input electrode 12 and first monitor electrode 15 being used as a common electrode (GND), the A directions 17 vibration that occurs due to the electric resonance signal and the B directions 18 vibration resonate with each other, with the result that the electric amplification signal is obtained between the first input electrode 12 and the output electrode 14. Further, when the piezoelectric element 11 is distorted in the C directions 19, the electric shock signal is obtained between the first monitor electrode 15 and the second monitor electrode 16.

The places where the first monitor electrode 15 and the second monitor electrode 16 are located may be at any given locations and one or each of these electrodes may be also common to another electrode if the electric shock signal is basically output therebetween. However, according to the location, even other signals than the electric shock signal are also caught thereby. In such a case, it is preferable to provide means for outputting selectively only the electric shock signal that is generated when the piezoelectric element has received a shock. Also, as the material of the piezoelectric element it is preferable to use a lead titanate material.

Also, although in this embodiment an explanation has been given of a case where the monitor electrode is provided on the piezoelectric transducer that uses the piezoelectric element to thereby enable the output of the electric shock signal, if the part is of a type using a piezoelectric element such as a piezoelectric buzzer wherein an electric signal is input to the input electrode of the piezoelectric element with an input electrode to thereby distort it continuously and thereby generate a sound, by providing the monitor electrode on the piezoelectric element within the part it becomes needless to say possible to output the electric shock signal. Also, the location of the monitor electrode of the piezoelectric element used in the piezoelectric buzzer may be at any given place of the piezoelectric element, and this monitor electrode may be common to another electrode, if basically the electric shock signal is output therefrom. According to the location, there is a case where the level of the electric shock signal is low or a case where another electric shock signal is caught thereby. Tn such a case, it is preferable to provide an amplification circuit or to provide means for enabling selective output of only an electric shock signal that is generated when the piezoelectric element has received a shock.

Figure 2:
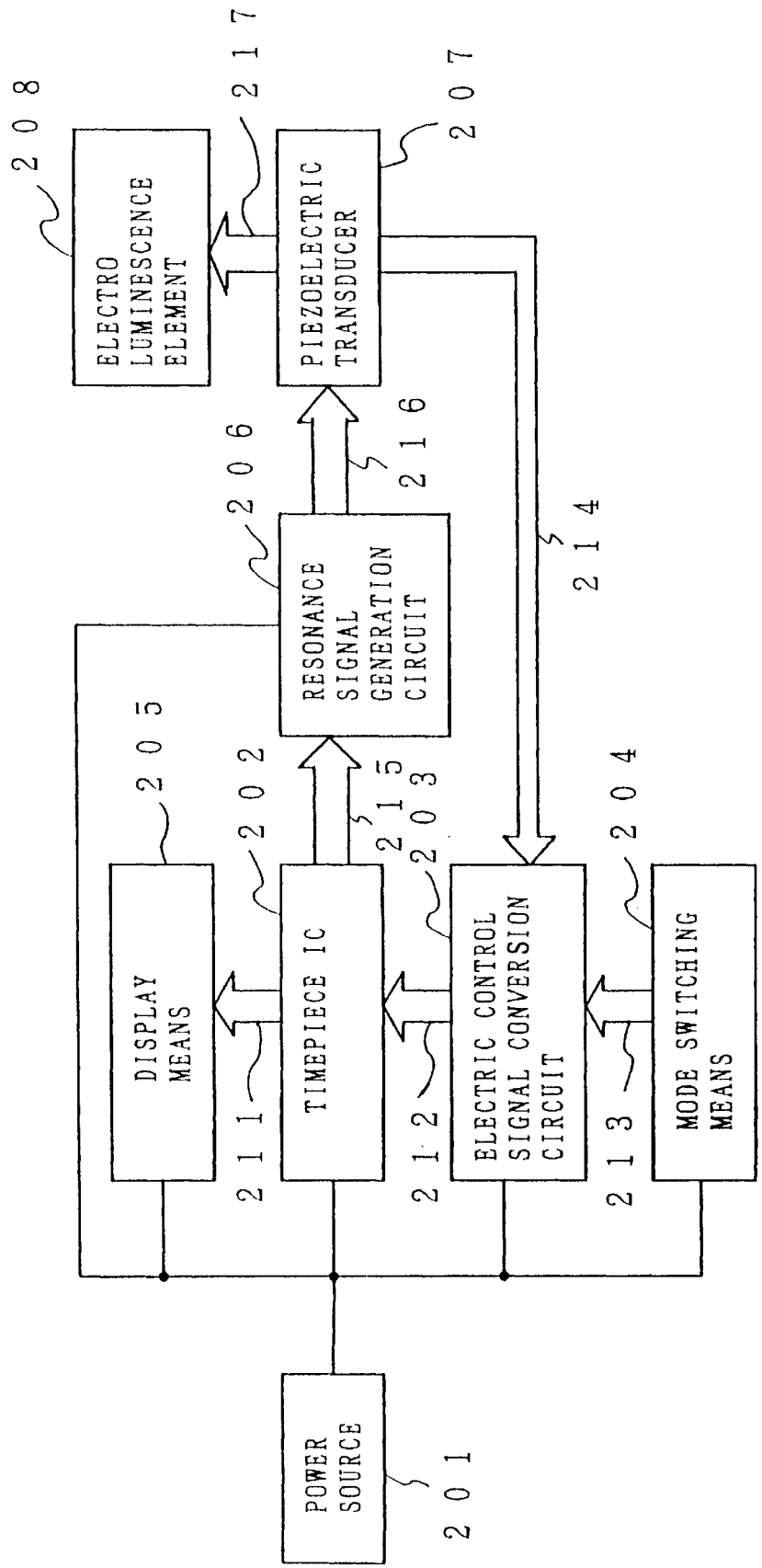
FIG. 2 is a simplified block diagram illustrating a wrist watch having a wrist band according to a second embodiment of the present invention.

FIG. 2 is a simplified block diagram illustrating a wrist watch having a wrist band according to a second embodiment of the present invention, which has loaded thereon a function for causing light emission of an electroluminescence element (hereinafter referred to as "EL") 208 by the use of an electric amplification signal 217 that has been stated in connection with the first embodiment and generated from the piezoelectric transducer 207 and a function for using as an electric control signal 212 an electric shock signal 214 that is generated by an external shock from the piezoelectric element that is used in the piezoelectric transducer 207.

This wrist watch comprises a power source 201, the piezoelectric transducer 207 for generating the electric amplification signal 217 that is needed for light emission from the EL 208, display means for displaying time or the like, an electric control signal conversion circuit 203 for converting to an electric control signal 212 an electric shock signal 214 that is generated when the piezoelectric transducer 207 has received a shock, mode switching means 204 for generating a mode control signal 213 for making a switch of whether or not the electric control signal conversion circuit 203 outputs the electric control signal 212, the EL 208 for emitting a light upon receipt of the electric amplification signal 217, a resonance signal generation circuit 206 for supplying an electric resonance signal 216 to the piezoelectric transducer 207, and a timepiece IC 202 for outputting a display control signal 211 for causing display means 205 to make various displays such as a time display and for outputting an EL light emission control signal 215 for controlling the drive of the resonance signal generation circuit 206. Further, the timepiece IC 202 causes a change in the display control signal 211 or EL light emission control signal 215 in correspondence with the electric control signal 212 from the electric control signal conversion circuit 203 to thereby control the display of the display means 205 or the light emission of the EL 208.

By adopting the above-mentioned construction, there are the following effects.

In the above-mentioned wrist watch according to this embodiment, in addition to the light emission function of the EL, as by, for example, shaking the wrist having the wrist watch mounted thereon twice and thereby causing the EL 208 to give forth light by the use of the resulting electric shock signal. 214 that is generated by applying shocks to the piezoelectric transducer 207 twice, it is possible to perform the light emission control of the EL 208 and the control of the display means 205 by the number of times that the wrist having the wrist watch mounted thereon is shaken. For this reason, the switch means for controlling the above-mentioned functions which have hitherto been needed to be used become unnecessary, with the result that miniaturization of the wrist watch can be achieved. Further, since the drive of the respective functions can be controlled by shaking the wrist having the wrist watch mounted thereon, the time and labour for manually operating the switches become also unnecessary.

It is to be noted that although in this embodiment reference has been made to the case provided with the resonance signal generation circuit 206, in a case where a clock signal having a certain frequency that has been taken out from a midway of the frequency divider stages for the quartz oscillation clock signal from the timepiece IC 202 can be used as the electric resonance signal 216, it is needless to say possible to omit the use of the resonance signal generation circuit 206. Also, in even the case of controlling the functions other than the function controlled by the timepiece IC 202 which has been shown in this embodiment, it is needless to say possible to cope with this by increasing the pattern in which the wrist having the wrist watch loaded thereon is shaked.

Further, although in this embodiment the wrist watch having loaded thereon the function for causing light emission of the piezoelectric transducer has been explained by way of example, by adopting in the electronic apparatus with this function loaded thereon or in the electronic apparatus with the piezoelectric transducer loaded thereon the mechanism which has been stated in this embodiment and in which the electric shock signal generated by applying a shock to the piezoelectric transducer is converted to an electric control signal, it is needless to say possible to reduce the number of the switch means and hence achieve miniaturization and also lessen the time and labour for manually operating the switches.

Figure 3:
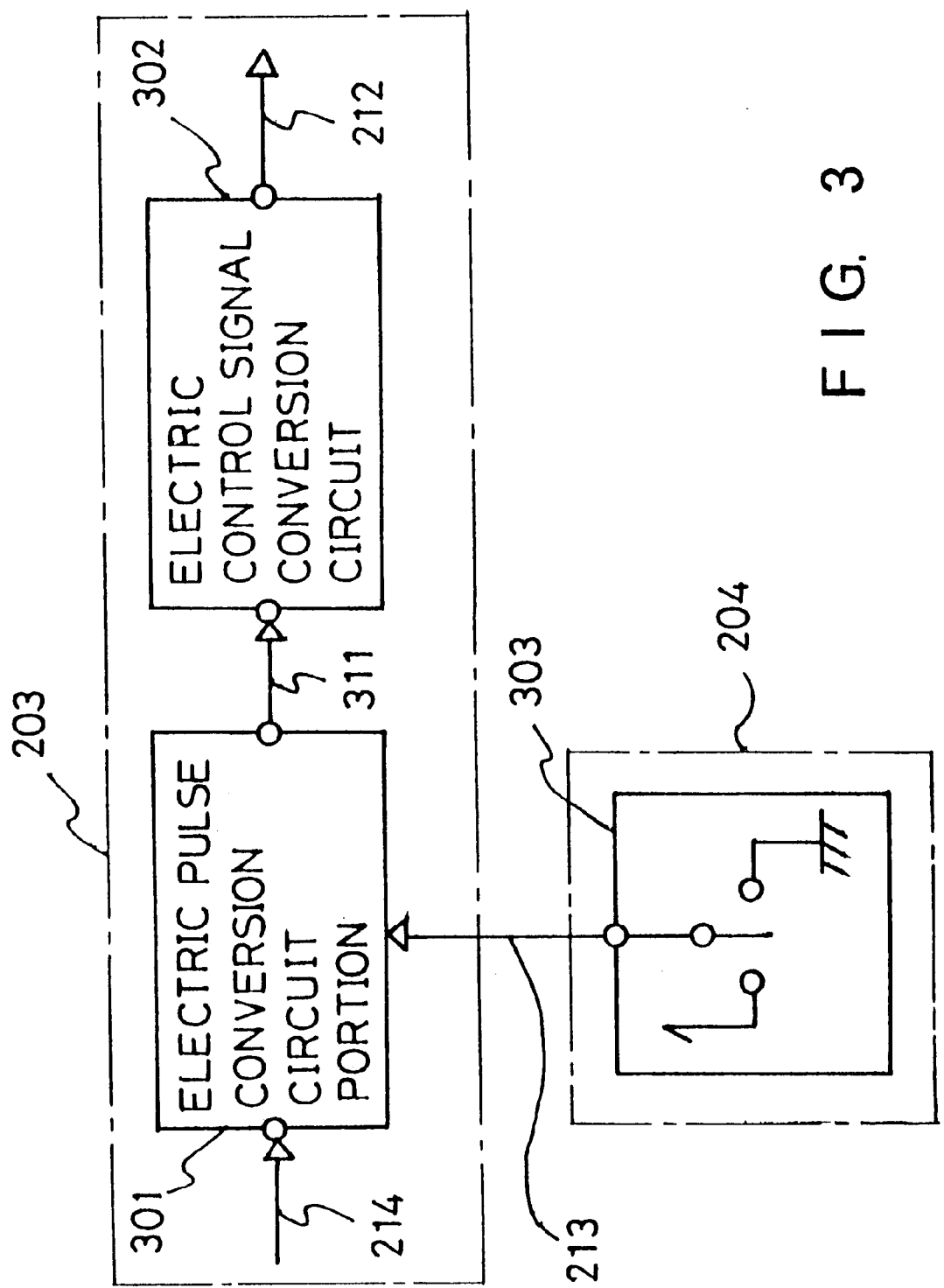
FIG. 3 is a simplified circuit diagram illustrating an electric control signal conversion circuit and mode switching means of a wrist watch having a wrist band according to the second embodiment of the present invention.

FIG. 3 is a simplified block diagram illustrating the electric control signal conversion circuit 203 and mode switching means 204 according to the second embodiment of the present invention.

First, the electric control signal conversion circuit 203 is composed of an electric pulse conversion circuit portion 301 for converting the electric shock signal 214 to an electric pulse signal 311 and an electric control signal conversion circuit 302 for converting the electric pulse signal 311 to the electric control signal 212.

Further, the electric pulse conversion circuit portion 301 is brought into operation or brought out of operation in correspondence with the electric shock signal 214. Namely, a case where the electric shock signal 214 is converted to the electric control signal 212 or a case where the electric shock signal 214 is not converted thereto can be selected according to the mode control signal 213.

Next, the mode switching means 204 is composed of a switch 303 for selecting Vdd (hereinafter referred to as "HIGH" level) and GND (hereinafter referred to as "LOW" level)

FIG. 4 is a circuit diagram illustrating the electric pulse conversion circuit portion 301 illustrated in FIG. 3.

The electric pulse conversion circuit is composed of a current-mirror type comparator 410 wherein a P-channel MOS 404, P-channel MOS 405, N-channel MOS 406 and N-channel 407 are connected as illustrated, Vref circuit 420 wherein a depression type N-channel MOS 402 and N-channel MOS 403 are connected as illustrated, and a NAND circuit 430. To the gate of the N-channel MOS 406 of the comparator 410 there is input a fixed voltage that has been prepared by the Vref circuit 420. To the gate of the other N-channel MOS 407 there is input the electric shock signal 214. The comparator result of the comparator circuit 410 is input to one input terminal of the NAND circuit 430, to the other input terminal of which there is input the mode control signal 213. Further, to each of the comparator 410 and Vref circuit 420 the voltage Vdd is connected through a P-channel MOS 401 the gate of which has the mode control signal 213 inputted thereto through an inverter circuit 440.

As a result of adopting the above-mentioned construction, by the output of the comparator circuit being inverted from the HIGH level to the LOW level during only a time period in which the voltage of the electric shock signal 214 is higher than the voltage of the output from the Vref circuit 420, the electric shock signal 214 is converted to the electric pulse signal. That is, since the electric shock signal 214 whose voltage is lower than the output voltage of the Vref circuit 420 is not converted to the electric pulse signal, the comparator 410 has a filter function, with the result that it is possible to cut off a low voltage of electric shock signal 214 which is generated from the piezoelectric element when the same has applied thereto a low degree of shock that occurs due to such an extent as to move the wrist having the wrist watch mounted thereon or when the same vibrates due to the reaction when the same has applied thereto a strong impact. Further, the level of the voltage of the electric shock signal to be cut off can be freely set by modifying the threshold voltage of each MOS of the Vref circuit 420 or the designed value thereof. Also, the electric pulse signal that has been output from the comparator 410 is inverted by the NAND circuit 430 if the mode control signal 213 is HIGH in voltage and is output as the electric pulse signal 212 and, if the mode control signal 213 is LOW in voltage, no voltage Vdd is supplied to the Vref circuit 420 and the comparator 410 which therefore are each kept out of operation whereby the current consumption is suppressed nor is the electric pulse output. Further, by the NAND circuit 430, the electric pulse signal 212 is fixed to be HIGH in level.

It is to be noted that although in this embodiment reference has been made to the case where the electric pulse conversion circuit portion has been composed of MOS's, function is obtained, if the same another switching device may be also available. Further, if the same function is obtained, a difference type of circuit construction may be also available. Also, the electric shock signal that is output from the part other than the piezoelectric transducer which uses a piezoelectric element can also be, needless to say, converted to the electric pulse signal.

FIG. 5 is a simplified circuit diagram illustrating the electric control signal conversion circuit portion 302 that is illustrated in FIG. 3.

A first shift register 501, second shift register 502, timer circuit 503 and NAND circuit 504 are connected as illustrated.

The timer circuit 503 detects both a rise of the electric pulse signal 212 input thereto through a first node 511 when the same goes high from its LOW level and a fall of the electric control signal 212 input thereto from a NAND circuit 504 through a fifth node 515 when the same goes low from its HIGH level, and, usually, outputs a reset signal. However, during a time period of several hundreds of milliseconds that succeeds the detection of the former rise, the timer circuits 503 outputs a reset release signal to a fourth node and, if the latter fall is detected during the time period of several hundreds of milliseconds in which the reset release signal is being output, this reset release signal output period is prolonged to several seconds.

The first shift register circuit 501 and second shift register 502 receive the electric pulse signal 212 input thereto through the first node 511 by their clock input terminals 522 and 526 and thereby detect a fall of the electric pulse signal 21.2 when the same goes low from its HIGH level, whereupon they output to their data output terminals 523 or 527 the voltage data at their data input terminal 521 or 525 that appears when they have detected this fall thereof. Further, they receive by their reset input terminal 524 or 528 the reset signal or reset release signal that is output from the timer circuit 503 through the fourth node 514. And when the reset signal has been input to one or each of them, the data output terminal 523 or 527 is compulsively fixed to be at the LOW level while, on the other hand, when the reset release signal has been input, the above-mentioned ordinary operation is performed.

And a second node 512 that connects the data output terminal 523 of the first shift register 501 and the data input terminal 525 of the second shift register 502 and a third node 513 connected to the data output terminal 527 of the second shift register 502 are connected to the inputs of the NAND circuit 504, whereby only when the levels of the both inputs have increased up to the HIGH level, the NAND circuit 504 outputs the electric control signal 212 that is LOW in level.

By adopting the above-mentioned construction, the following operation becomes possible.

In a case where the electric pulse conversion circuit portion is made OFF by the mode control signal to thereby make the electric pulse signal 212 fixed at the HIGH level, or where the electric pulse conversion circuit portion is made ON from this state by the mode control signal and, with no electric shock signal being input thereto, the electric pulse signal is kept LOW in level, the data output terminals 523 and 527 of the first shift register circuit 501 and second shift register circuit 502 are forced to go low in level by the timer circuit 503, whereby the two inputs of the NAND circuit 504 go low in level, with the result that the electric control signal 212 goes high in level.

When the electric shock signal is converted to the electric pulse signal 212 and a pulse waveform is input to the first node 511 once only, the timer circuit 503 detects a rise of the pulse waveform from LOW to HIGH to thereby output a reset release signal. As a result, the first shift register circuit 501 and second shift register 502 become operative and, due to a fall of the pulse waveform from HIGH to LOW, the second node 512 goes high. However, since the third node remains to be low, the output electric control signal 212 of the NAND circuit 504 remains to be HIGH in level. Tn a case where a second pulse waveform has been input during a time period of several milliseconds in which the timer circuit 503 switches its output from the reset release signal to the reset signal, the third node also goes high, with the result that the output electric control signal 212 of the NAND circuit 504 goes LOW in level. Therefore, the output time period of the reset release signal from the timer circuit 503 is prolonged to several seconds, with the result that the output of the NAND circuit 504 is kept LOW in level until the reset release signal is switched to the reset signal. However, if otherwise, the second node 512 also goes low due to the reset signal output from the timer circuit 503 and, even if a second pulse waveform has been thereafter input, since the operation associated therewith is the same as the operation that occurs when the first pulse waveform has been input, the output electric control signal 212 of the NAND circuit 504 remains to be HIGH in level.

That is to say, unless a shock to the piezoelectric transducer is applied two times or more and inputting a pulse waveform signal is input to the first node 511 two times or more during a time period of several milliseconds in which the timer circuit 503 is outputting a reset release signal, it is impossible to output a low level of signal as the electric control signal 212 for several seconds. On this account, if, for example, the timepiece IC causes the EL to give forth light during only a time period in which the electric control signal 212 is being low in level, by shaking the wrist having mounted thereon the wrist watch according to this embodiment two times as mentioned above it is possible to realize a function such as that which causes light emission of the EL for several seconds.

It is to be noted that the circuit that constitutes the above-mentioned electric pulse signal conversion circuit portion is a circuit example which causes the generation of the electric control signal that can be generated with the use of a single switch or so. When the generation of a more complex electric control signal is wanted, it is preferable to use several of these circuits in combination. Also, if the same function as that which is attainable with this circuit is obtained, it is possible to adopt another circuit construction.

FIG. 6 is a simplified block diagram illustrating a wrist watch with a wrist band according to a third embodiment of the present invention that has loaded thereon a function for sounding a piezoelectric buzzer and a function stated in connection with the first and second embodiments for using as the electric control signal 212 the electric shock signal 214 that is generated when the piezoelectric element used in the piezoelectric buzzer receives a shock by way of an external shock.

The wrist watch comprises a power source 201, a distortion signal generation circuit 601 for generating an electric distortion signal 612 that is needed to distort a piezoelectric buzzer 602 continuously, display means 205 for making a display of, for example, time, an electric control signal conversion circuit 203 for converting to an electric control signal 212 an electric shock signal 214 that is generated when the piezoelectric buzzer 602 has received a shock, mode switching means 204 for generating a mode control signal 213 for making a switch on whether or not the electric control signal conversion circuit 203 outputs the electric control signal 212, the piezoelectric buzzer 602 for being sounded upon receipt of the electric distortion signal 612, and a timepiece IC 202 for outputting a display control signal 211 for causing the display means 205 to make various displays such as time display and a buzzer control signal 611 for controlling the drive of the distortion generation circuit 601. Further, in correspondence with the electric control signal 212 from the electric control signal conversion circuit 203 causes a change in the display control signal 211 or buzzer control signal 611 to thereby control the display that is made by the display means 205 or the drive of the piezoelectric buzzer 602.

By adopting the above-mentioned construction, there are the following effects.

In the above-mentioned wrist watch according to this embodiment, in addition to the buzzer function of the piezoelectric buzzer 602, as by, for example, shaking the wrist having the wrist watch of this embodiment mounted thereon twice and, by utilizing the resulting electric shock signal 214 that is generated by applying shocks to the piezoelectric buzzer 602 twice, making the piezoelectric buzzer 602 OFF and thereby causing it to generate no sound, it is possible to perform the drive of the piezoelectric buzzer 602 and the control of the display means 205 by controlling the number of shakes of the wrist having the wrist watch mounted thereon. For this reason, the switch means for controlling the above-mentioned functions which have hitherto been needed to be used become unnecessary, with the result that miniaturization of the wrist watch can be achieved. Further, since the drive of the respective functions can be controlled by shaking the wrist having the wrist watch mounted thereon, the time and labour for manually operating the switches can be omitted.

It is to be noted that although in this embodiment reference has been made to the case provided with the distortion signal generation circuit 601, in a case where a clock signal having a certain frequency that has been taken out from a midway of the frequency divider stages for the quartz oscillation clock signal from the timepiece IC 202 can be used as the electric distortion signal 612, it is needless to say possible to omit the use of the distortion signal generation circuit 601. Also, in even the case of controlling the functions other than the function controlled by the timepiece IC 202 which has been shown in this embodiment, it is needless to say possible to cope with this by increasing the pattern in which the wrist having the wrist watch loaded thereon is shaked.

Further, although in this embodiment the wrist watch having the piezoelectric buzzer loaded has thereon been explained by way of example, by adopting in the electronic apparatus having the piezoelectric buzzer loaded thereon the mechanism which has been stated in this embodiment and in which the electric shock signal generated by applying a shock to the piezoelectric buzzer is converted to an electric control signal, it is needless to say possible to reduce the number of the switch means and hence achieve miniaturization and also lessen the time and labour for manually operating the switches.

Figure 7:
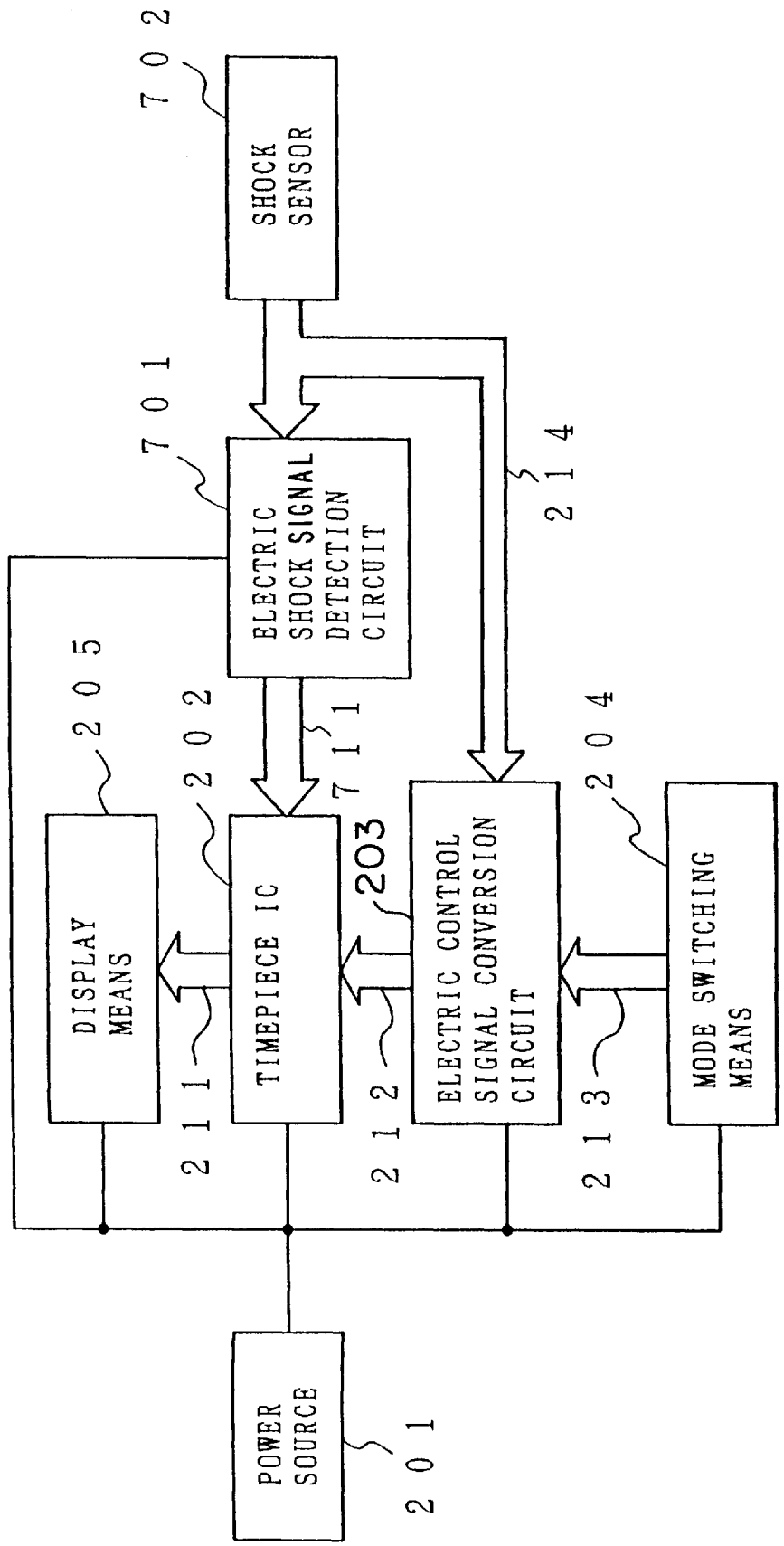
FIG. 7 is a simplified block diagram illustrating a wrist watch having a wrist band according to a fourth embodiment of the present invention.
Figure 8:
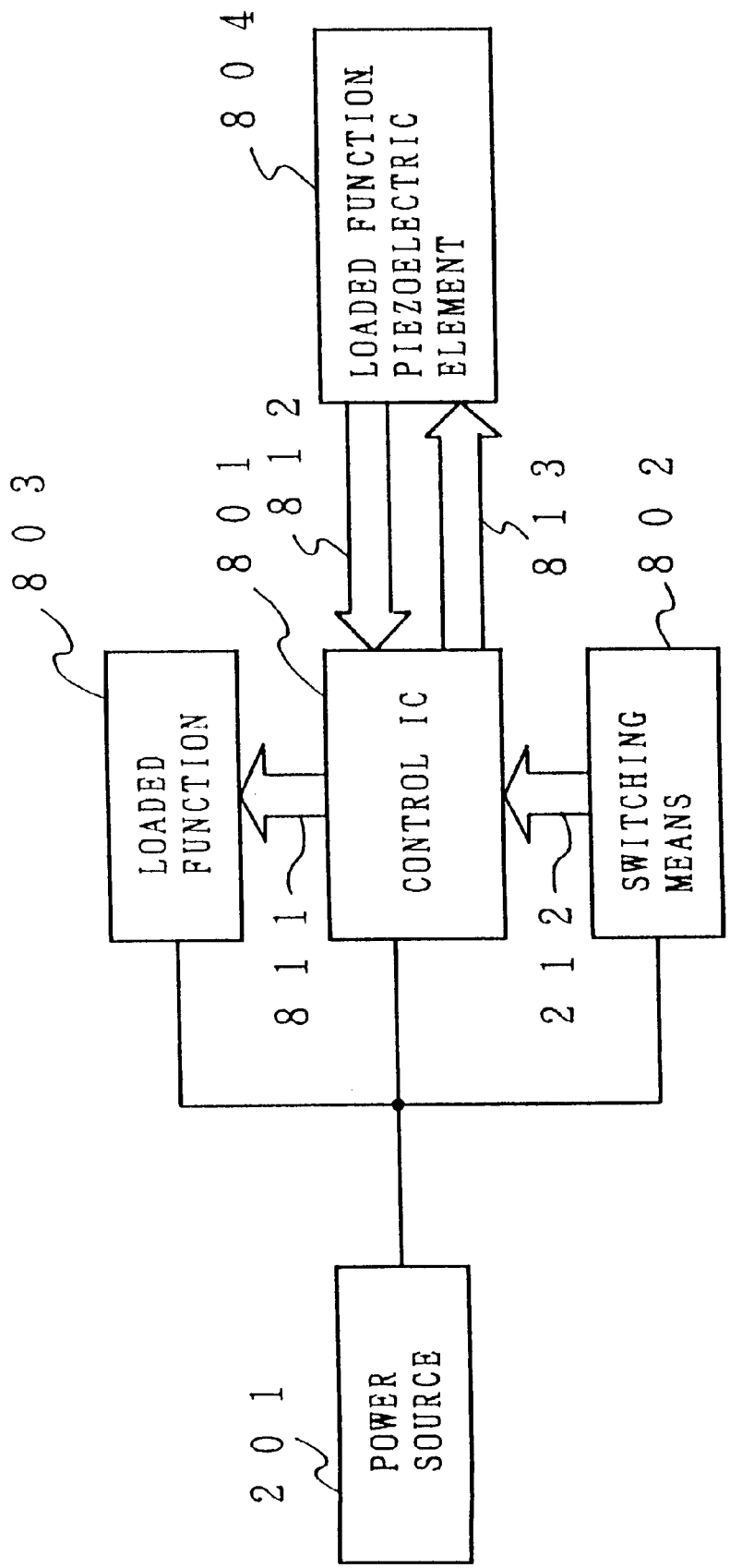
FIG. 8 is a simplified block diagram illustrating a conventional electronic apparatus that contains a piezoelectric element therein.

FIG. 7 is a simplified block diagram illustrating a wrist watch having a wrist band according to a fourth embodiment of the present invention which has loaded thereon a function for detecting a shock by a shock sensor 702 that outputs the electric shock signal 214 that is generated when the shock has been applied to the piezoelectric element and a function for using the electric shock signal 214 as an electric control signal 212 that has been stated in connection with the second embodiment.

This wrist watch comprises a power source 201, an electric shock signal detection circuit 701 that receives an electric shock signal 214 that is generated when the shock sensor 702 has received a shock and has been distorted and converts it to a shock detection signal 711, display means 205 for displaying time or the like, an electric control signal conversion circuit 203 for converting the electric shock signal 214 to an electric control signal 212, mode switching means 204 for generating a mode control signal 213 for making a switch on whether or not the electric control signal conversion circuit 203 outputs the electric control signal 212, the shock sensor 702 for outputting the electric shock signal 214, and a timepiece IC 202 for outputting a display control signal for causing the display means 205 to make a display for informing the detection of the shock in correspondence with the shock detection signal 711 that has been received thereby, various displays such as time display, etc. Further, the timepiece IC 202 controls various functions such as causing a change in the display control signal 211 in correspondence with the electric control signal 212 from the electric control signal conversion circuit 203 and thereby controlling the display of the display means 205.

By adopting the above-mentioned construction, there are the following effects.

In the above-mentioned wrist watch according to this embodiment, in addition to the shock detection function for detecting a shock by the shock sensor 702, as by, for example, shaking the wrist having the wrist watch of this embodiment mounted thereon twice and, by utilizing the resulting electric shock signal 214 that is generated by applying shocks to the shock sensor 702 twice, making a switch of the contents to be displayed on the display means 205, it is possible to control the respective functions such as control of the display means 205 by controlling the number of shakes of the wrist having the wrist watch mounted thereon. For this reason, the switch means for controlling the above-mentioned functions which have hitherto been needed to be used become unnecessary, with the result that miniaturization of the wrist watch can be achieved. Further, since the drive of the respective functions can be controlled by shaking the wrist having the wrist watch mounted thereon, the time and labour for manually operating the switches can be omitted.

Also, in even the case of controlling the functions other than the function controlled by the timepiece IC 202 which has been shown in this embodiment, it is needless to say possible to cope with this by increasing the pattern in which the wrist having the wrist watch loaded thereon is shaked.

Further, although in this embodiment the wrist watch having the shock sensor loaded thereon has been explained by way of example, by adopting in the electronic apparatus with this shock sensor loaded thereon the mechanism which has been stated in this embodiment and in which the electric shock signal generated by applying a shock to the shock sensor is converted to an electric control signal, it is needless to say possible to reduce the number of the switch means and hence achieve miniaturization and also lessen the time and labour for manually operating the switches.

What is claimed is:

1. An electronic timepiece comprising: a piezoelectric transducer for generating an electric amplification signal, the piezoelectric transducer having a piezoelectric element; a resonance signal generation circuit for generating an electric resonance signal and outputting the electric resonance signal to the piezoelectric transducer to generate the electric amplification signal; an electroluminescence element for emitting light upon receipt of the electric amplification signal; an electric control signal conversion circuit for converting an electric shock signal to an electric control signal only when a voltage of the electric shock signal is higher than a preselected voltage level, the electric shock signal being generated when the piezoelectric element of the piezoelectric transducer has received an external shock; and control means for outputting a control signal to the resonance signal generation circuit to control the light emission of the electroluminescence element in accordance with the electric control signal.

2. An electronic timepiece according to claim 1; wherein the electronic timepiece comprises a wrist watch.

3. An electronic timepiece according to claim 1; further comprising display means for displaying a function of the electronic timepiece; and wherein the control means includes means for controlling the display means in accordance with the electric control signal.

4. An electronic timepiece according to claim 3; wherein the display means comprises a time display means for displaying time.

5. An electronic timepiece according to claim 3; wherein the electronic timepiece comprises a wrist watch.

6. An electronic timepiece comprising: a piezoelectric buzzer for generating a sound, the piezoelectric buzzer having a piezoelectric element; a distortion signal generation circuit for generating an electric distortion signal and outputting the electric distortion signal to the piezoelectric element of the piezoelectric buzzer to generate a sound; an electric control signal conversion circuit for converting an electric shock signal to an electric control signal only when a voltage of the electric shock signal is higher than a preselected voltage level, the electric shock signal being generated when the piezoelectric element of the piezoelectric buzzer has received an external shock; display means responsive to a control signal for displaying a function; and control means for outputting a control signal to at least one of the distortion signal generation circuit and the display means in accordance with the electric control signal.

7. An electronic timepiece according to claim 6; wherein the display means comprises a time display means for displaying time.

8. An electronic timepiece according to claim 6; wherein the electronic timepiece comprises a wrist watch.

9. An electronic timepiece comprising: a shock sensor for detecting a shock and having a piezoelectric element, the shock sensor outputting an electric shock signal when the piezoelectric element has received an external shock; an electric shock signal detection circuit for detecting the electric shock signal outputted by the shock sensor and outputting a shock detection signal; an electric control signal conversion circuit for converting the electric shock signal outputted by the shock sensor to an electric control signal only when a voltage of the electric shock signal is higher than a preselected voltage level; display means responsive to a display control signal for displaying a function; and control means for outputting a display control signal to the display means on the basis of the shock detection signal from the electric shock signal detection circuit to display the function and on the basis of the electric control signal from the electric control signal conversion circuit to control the display of the display means.

10. An electronic timepiece according to claim 9; wherein the display means comprises a time display means for displaying time.

11. An electronic timepiece according to claim 9; wherein the electronic timepiece comprises a wrist watch.

12. An electronic timepiece according to claim 6; wherein the control means outputs a control signal to the distortion signal generation circuit in accordance with the electric control signal.

13. An electronic timepiece according to claim 6; wherein the control means outputs a control signal to the display means in accordance with the electric control signal.

14. An electronic timepiece according to claim 6; wherein the control means outputs a control signal to the distortion signal generation circuit and the display means in accordance with the electric control signal.

* * * * *